United States Patent [19]

Sasaki et al.

[11] 4,404,738
[45] Sep. 20, 1983

[54] METHOD OF FABRICATING AN I²L ELEMENT AND A LINEAR TRANSISTOR ON ONE CHIP

[75] Inventors: Gen Sasaki, Yokohama; Minoru Taguchi, Omiya; Koichi Kanzaki, Kawasaki; Akihiko Furukawa, Tokyo, all of Japan

[73] Assignee: Tokyo Shibaura Denki Kabushiki Kaisha, Japan

[21] Appl. No.: 305,721

[22] Filed: Sep. 25, 1981

Related U.S. Application Data

[62] Division of Ser. No. 153,952, May 28, 1980, abandoned.

[30] Foreign Application Priority Data

May 31, 1979 [JP] Japan .................................. 54-66759
Jul. 23, 1979 [JP] Japan .................................. 54-92585

[51] Int. Cl.³ ...................... H01L 21/20; H01L 21/74
[52] U.S. Cl. ................................ 29/577 C; 29/576 E; 29/576 W; 29/578; 148/1.5; 148/175; 148/187; 357/35; 357/46; 357/92
[58] Field of Search ................ 29/577 C, 578, 576 E, 29/576 W; 148/175, 187, 1.5; 357/44, 46, 35, 36, 92

[56] References Cited

U.S. PATENT DOCUMENTS

| | | | |
|---|---|---|---|
| 3,566,218 | 2/1971 | Widlar et al. | 148/186 X |
| 3,817,794 | 6/1974 | Beadle et al. | 148/187 X |
| 3,962,717 | 6/1976 | O'Brien | 148/175 X |
| 4,043,849 | 8/1977 | Kraft et al. | 148/187 |
| 4,069,495 | 1/1978 | Masuoka | 357/46 |
| 4,087,900 | 5/1978 | Yiannoulos | 29/578 |
| 4,115,797 | 9/1978 | Hingarh et al. | 357/92 X |
| 4,197,147 | 4/1980 | Bergmann et al. | 29/578 X |
| 4,228,448 | 10/1980 | Lalumia et al. | 357/92 X |
| 4,260,906 | 4/1981 | Tokumaru et al. | 357/92 X |
| 4,272,307 | 6/1981 | Mayrand | 357/92 X |

FOREIGN PATENT DOCUMENTS

| | | | |
|---|---|---|---|
| 2557911 | 6/1977 | Fed. Rep. of Germany | 357/92 |
| 53-38276 | 4/1978 | Japan . | |
| 54-12683 | 1/1979 | Japan | 357/92 |

OTHER PUBLICATIONS

Kindl, T. E., "LSI System" I.B.M. Techn. Discl. Bull., vol. 21, No. 2, Jul. 1978, pp. 494–497.

Primary Examiner—W. G. Saba
Attorney, Agent, or Firm—Finnegan, Henderson, Farabow, Garrett & Dunner

[57] ABSTRACT

An integrated circuit device is provided in which an I²L element and linear transistor are formed on a single chip such that they coexist. In this device, the base and collector regions of a vertical transistor of the I²L element are formed such that they are deeper than the base and emitter regions of the linear transistor.

4 Claims, 12 Drawing Figures

METHOD OF FABRICATING AN I²L ELEMENT AND A LINEAR TRANSISTOR ON ONE CHIP

This is a divisional application Ser. No. 153,952, filed May 28, 1980, now abandoned.

This invention relates to an integrated circuit device and the method of fabricating it and in particular an integrated circuit device in which an integrated injection logic (I₂L) element and a linear transistor coexist.

It is the recent practice to form an I²L element and linear transistor on a common chip to provide a logic gate circuit. Where the I²L element and linear transistor are formed on a common chip, in the prior art an N-type epitaxial layer is formed on a P-type semiconductor substrate. The epitaxial layer is divided by P+-type isolating regions into a plurality of N-type island regions. An N+-type buried region is formed between each of the island regions and the semiconductor substrate. In the island region forming the I²L element and the island region forming the linear transistor, an injector region, base region of the vertical transistor of the I²L element and base region of the linear transistor are formed by the same diffusion process.

Likewise, the collector region of the vertical transistor and emitter and collector regions of the linear transistor are formed by the same diffusion step. In the I²L element and linear transistor so formed, the vertical transistor of the I²L element and base region of the linear transistor have substantially the same diffusion depth. However, this involves the following problem. Where minority carriers are accumulated in an N-type island region between the N+type buried region and the base region of the vertical transistor in the I²L element, the delay time of the vertical transistor is increased and the operation speed of the I²L element decreased. It is preferred that a distance between the base region and the buried region be made as small as possible. It is necessary, however, that in the linear transistor a distance between the base region and the buried region be made greater so as to make the emitter-collector withstand a larger voltage. That is, the I²L element and linear transistor must meet reciprocal requirements. In the prior art the requirement is not satisfied for the reason as set out above and it is therefore necessary that the characteristic of one of either the I²L element or linear transistor be sacrified or a compromise between both the characteristics be made.

It is accordingly the object of this invention to provide an integrated circuit device which permits the coexistence of an I²L element and linear transistor without lowering their characteristics.

According to this invention an integrated circuit device is provided in which the base region of a vertical transistor of an I²L element is deeply formed in an island region and the base region of a linear transistor is shallowly formed in the island region by virtue of ion implantation.

According to this invention there is provided an integrated circuit device in which the collector of a vertical transistor in an I²L element is formed to have an impurity concentration lower than that of the emitter region of a linear transistor.

This invention can be more fully understood from the following detailed description when taken in conjunction with the accompanying drawings, in which.

Figure 1:
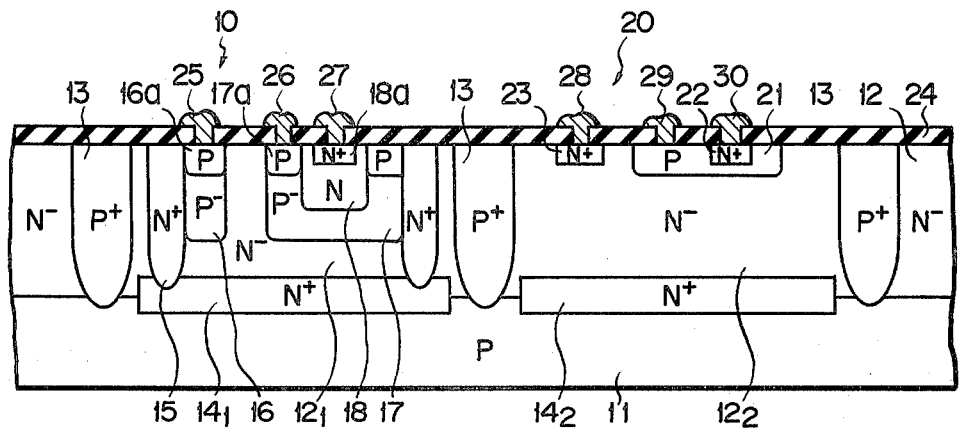
FIG. 1 shows a structure of an integrated circuit device according to one embodiment of this invention.

In an integrated circuit device shown in FIG. 1 an N⁻-type epitaxial layer 12 on a P-type semiconductor substrate 11 is divided by a P+-type isolating region 13 into a plurality of island regions $12_1$, $12_2$ .... N+-type buried regions $14_1$, $14_2$ ... are formed between the semiconductor substrate 11 and the respective island regions $12_1$, $12_2$.... An N+-type region 15 is formed in the island region $12_1$ and reaches the N+-type buried region $14_1$. P⁻-type regions 16 and 17 are formed in the island regions $12_1$ apart from each other, the P⁻-type region 16 serving as an injector for I²L element 10 and the P⁻-type region 17 as the base of a vertical transistor. An N-type region 18 is formed in the P⁻-type region 17 and acts as the collector of the vertical transistor. P-type ohmic contact regions 16a and 17a are formed on the P⁻-type regions 16 and 17, respectively, and an N+-type ohmic contact region 18a is formed in the N-type region 18. A P-type region 21 is formed in a shallow manner in the N-type island region $12_2$ and functions as the base of a linear transistor 20. N+ regions 22 and 23 are formed in the P-type region 21 and island region $12_2$, respectively and function as the emitter and collector of the linear transistor. On the surface of the above-mentioned IC device is formed an insulating layer 24 having contact holes formed therein. Al electrodes 25, 26, 27, 28, 29 and 30 are formed through the contact holes.

Since the I²L element has the deeply formed base region 17 of the vertical transistor and shallowly formed base region of the linear transistor, the maximum operation speed of the I²L element was two times as rapid as that of an IC device in which a conventional I²L element and linear transistor coexist. Moreover, it has also been found that the collector-emitter withstand voltage of the linear transistor becomes a value of 20 V or more.

The IC device of this invention is difficult to manufacture according to a method using a normal doped layer and was not able to be fabricated thereby. According to this invention the IC device is achieved using an ion implantation technique.

The manufacture of the IC device as shown in FIG. 1 will now be explained below.

Figure 2A:
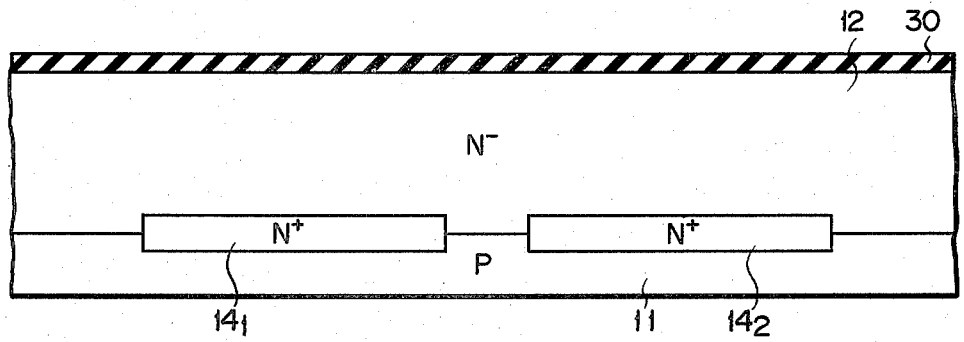
FIGS. 2A to 2H show structures of an integrated circuit device in the manufacturing steps of an IC device of FIG. 1.
Figure 2B:
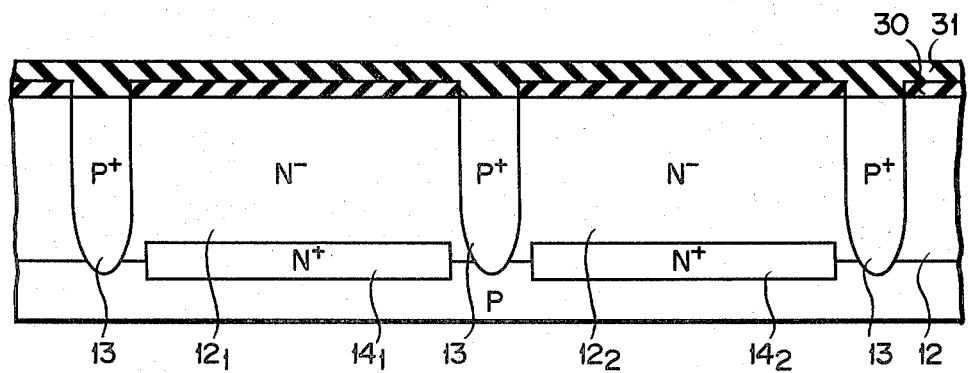
Figure 2C:
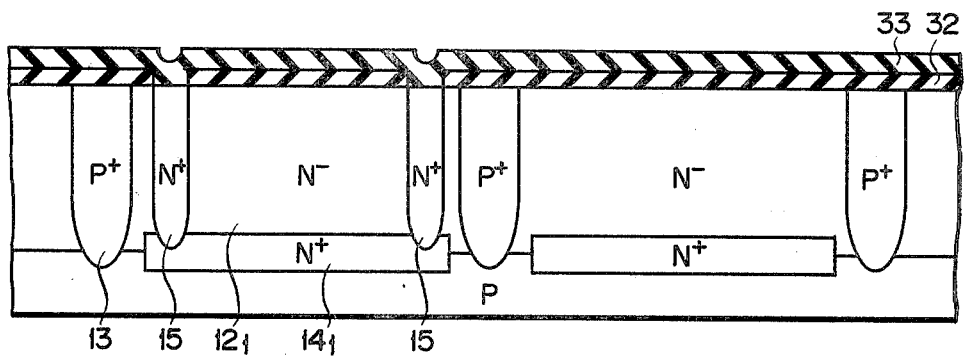
Figure 2D:
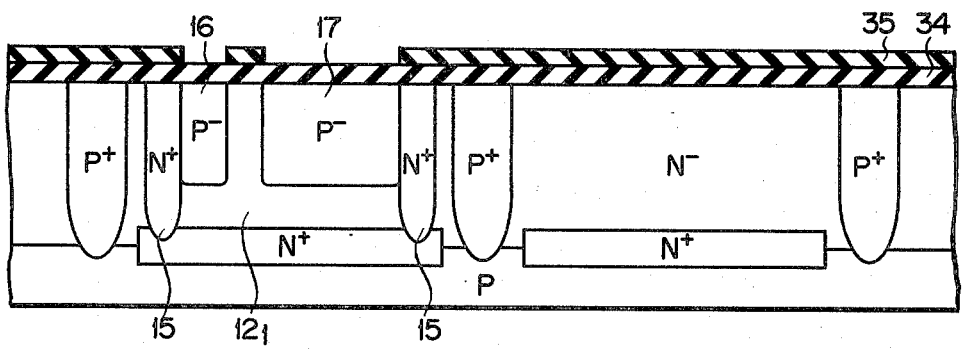
Figure 2E:
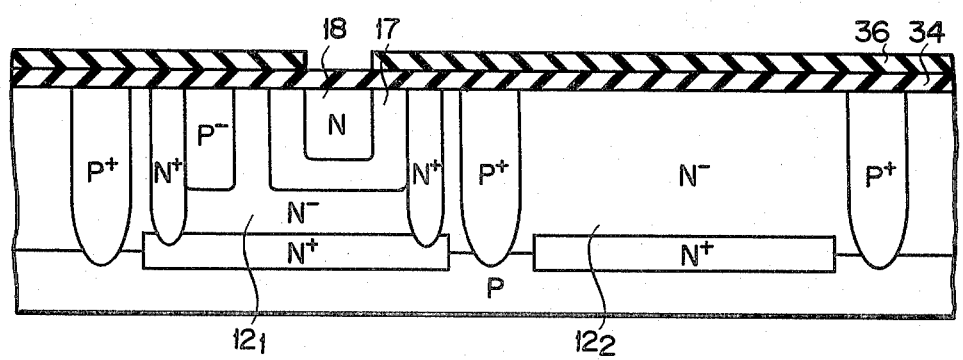

As shown in FIG. 2A an N⁻-type epitaxial layer 12 with a specific resistance of 1.5Ω cm and a thickness of 3.5 μm is formed on a P-type silicon substrate 11. N+-type buried regions $14_1$, $14_2$ .... are formed between the silicon substrate 11 and the epitaxial layer 12. An oxide layer 30 is formed on the epitaxial layer 12. The oxide layer 30 is selectively photo-etched to partially expose the epitaxial layer 12. Then, a P+-type doped layer 31 is formed on the exposed surface of the epitaxal layer 12 and on the oxide layer 30 as shown in FIG. 2B. Through heat treatment an impurity in the doped layer 31 is diffused into the epitaxial layer 12 to form P+-type isolating regions 13. As a result, the epitaxial layer 12 is divided into a plurality of N⁻-type island regions $12_1$, $12_2$ ..... After the oxide layer 30 and doped layer 31 are all removed, in a process shown in FIG. 2C an oxide layer 32 is formed on the whole surface of the epitaxial layer 12 by C V D method and then selectively apertured by photo-etching to expose partially the island region 12₁. An N⁺-type doped layer 33 is formed on the oxide layer 32 and exposed portions of the island region 12₁. The impurity included in the doped layer 33 is diffused in the island region 12₁ to form an N⁺-type region 15. After the doped layer 33 and oxide layer 32 are removed, a 1000 A-thick oxide layer 34 is formed on the entire surface of the epitaxial layer 12 as shown in FIG. 2D. On the oxide layer 34 is a photo-resist mask 35, through which boron ion is injected at a concentration of $2 \times 10^{13}/cm^2$ into the island region 12₁ and, after heat treatment, P⁻-injector region 16 and base region 17 are formed in the region 12. The P⁻-base region 17 with a thickness of 1.5 μm and a specific resistance of 2K Ω/12 is formed. The mask 35 is removed. In a process shown in FIG. 2E a mask 36 for a collector is formed by a photoetching method on the oxide layer 34 and phosphorus ion is injected at a concentration of $2 \times 10^{14}/cm^2$ utilizing the collector mask, followed by heat treatment. By so doing, a collector region 18 with a depth of 1.0 μm is formed in the base region 17. After the collector mask 36 is removed, a photo-resist mask 37 for the base of the linear transistor and ohmic contact is formed on the oxide layer 34.

Figure 2F:
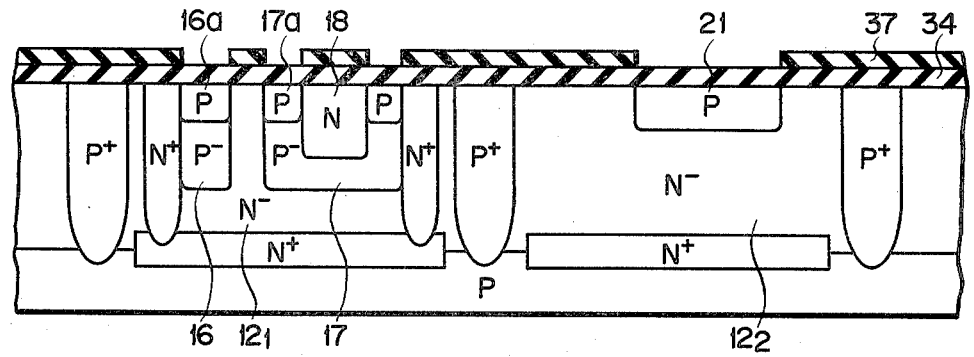
Figure 2G:
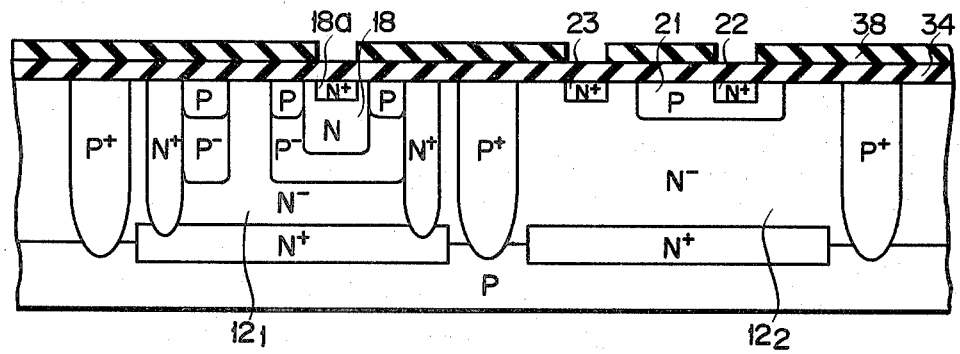
Figure 2H:
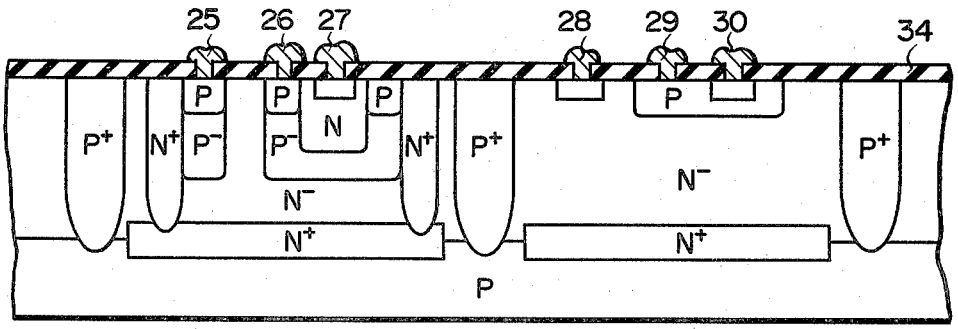

Through the photo-resist mask 37, boron ion is injected at a concentration of $1 \times 10^{14}/cm^2$ into the injector region 16, base region 17 and N⁻-type island region 12₂, followed by heat treatment. As a result, as shown in FIG. 2F a base region 21 of a linear transistor 20 is formed on the N⁻-type island region 12₂ such that it has a depth of 0.5μ and a specific resistance of 500Ω/□. Ohmic contact regions 16a and 17a are formed on the injector and base regions 16 and 17, respectively. In a process shown in FIG. 2G a photo-resist mask 38 is formed by photo-etching and, through the use of the mask 38, arsenic ion is injected into a base region 21 of the llinear transistor, island region 12₂ and collector region 18 of the vertical transistor, followed by heat treatment. By this process, N⁺-type emitter region 22 and N⁺-type collector region 23 are formed in the base region 21 and island region 12₂, respectively, the emitter region 22 having a depth of 0.2μ. An ohmic contact region 18a is formed in the collector region 18. Then, an oxide layer is formed on the resultant structure and contact holes are formed. Then, aluminum-silicon for electrodes is vapor deposited onto the surface of the resultant structure, which in turn is subjected to patterning to form electrodes 25 to 30 as shown in FIG. 2H. Through the use of the above-mentioned ion implantation method the base region of the vertical transistor of the I²L element can be deeply formed and the base region of the linear transistor be shallowly formed. Both the elements can be formed on a common chip without lowering the characteristics of the I²L element and of the linear transistor. In the above-mentioned method the I²L device is formed first. This is done so that the heat treatment or drive-in when the active region of a normal linear transistor is formed imparts less influence over the I²L element. Where almost no influence is given to the I²L element the linear transistor may be later formed.

Figure 3:
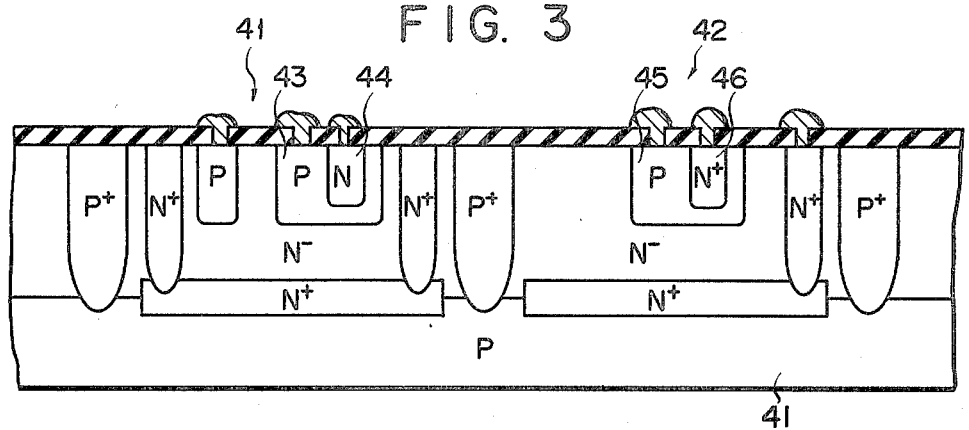
FIG. 3 shows a structure of an IC device according to another embodiment of this invention.
Figure 4:
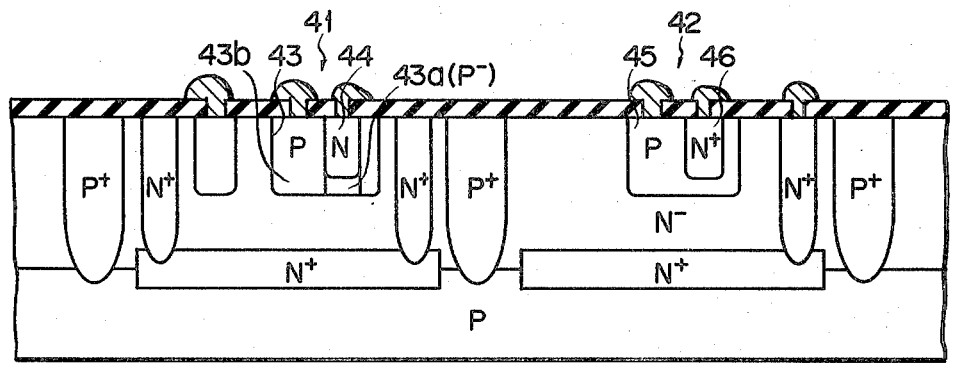
FIG. 4 shows a structure of an IC device according to still another embodiment of this invention.

Since in the above-mentioned embodiment the impurity concentration of the collector region of the vertical transistor is formed to have an impurity concentration lower than that of the emitter region of the linear transistor with the base region of the vertical transistor deeply formed and the region (for example, the base region) of the linear transistor shallowly formed, the characteristics of the I²L element and linear transistor are further improved. A desired characteristic is also obtained merely by deciding the impurity concentration as mentioned above. In FIG. 3 the base region 43 and collector region 44 of the vertical transistor and base region 45 and emitter region 46 of the linear transistor are formed to have the same depth, but the impurity concentration of the base region 43 of the vertical transistor is set lower than that of the emitter region 46 of the linear transistor. In such an IC device the basecollector withstand voltage of the vertical transistor of the I²L element is improved. In order to improve the current amplification factor βup of the vertical transistor of I²L element in the device of FIG. 3 the base region 43 of the vertical transistor may be formed to have a double-base structure as shown in FIG. 4. That is, the base region 43 is constituted by an internal base section 43a immediately below the collector region 44 and an external base section 43b surrounding the internal base section 43a. The impurity concentration of the internal base section 43a is lower than that of the external base section 43b. If the base region of the double-base structure is used, the Gummel number becomes smaller and the base width of the I²L element wider, resulting in a greater βup of the I²L element.

Figure 5:
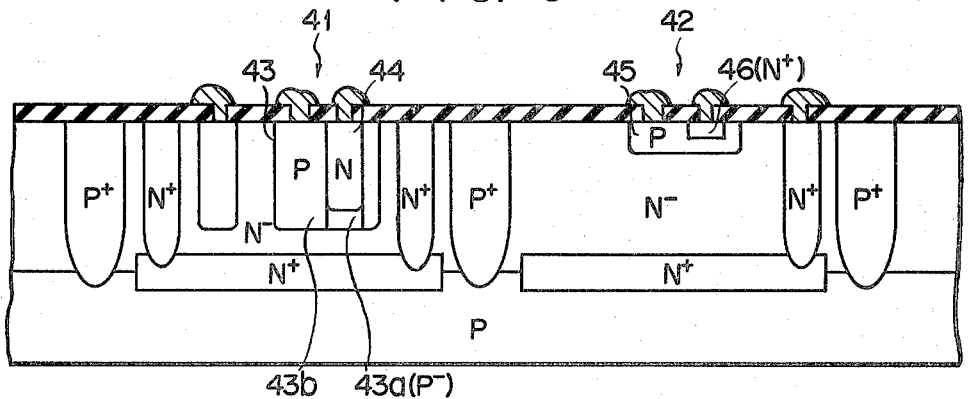
FIG. 5 shows a structure of an IC device according to yet another embodiment of this invention.

In the embodiment shown in FIG. 5 not only is the base region 43 formed to have a double structure, but also it is formed more deeply than the base region 45 of the linear transistor 42. In this embodiment the base region 43 has a depth of 2 μm or more and the base region 45 a depth of 0.5 μm or less. The impurity concentration of the collector region 44 of the vertical transistor set lower than that of the emitter region of the linear transistor. In the IC device of FIG. 5 the collector-emitter withstand voltage $V_{CEO}$ and collector-base withstand voltage $V_{CBO}$ of the vertical transistor of the I²L element are 7 to 8 V and 9 to 10 V, respectively, and the maximum operation speed is 6 ns. By forming the base region of the vertical transistor of the I²L element more deeply than the base region of the linear transistor and/or forming the impurity concentration of the collector region of the vertical transistor of the I²L element at a level lower than that of the emitter region of the linear transistor, the I²L element and linear transistor can be formed on the same chip such that they coexist with better characteristics.

What we claim is:

1. A method of manufacturing an integrated circuit comprising at least one I²L element and at least one linear transistor, comprising: a first step of forming on a semiconductor substrate of a first conductivity type high impurity concentration layers of a second conductivity type; a second step of growing an epitaxial layer of the second conductivity type on said substrate and said high impurity concentration layers; a third step of separating said epitaxial layer into a plurality of island regions by forming an isolating region of the first conductivity type, a fourth step of forming a high impurity concentration region of the second conductivity type in at least one of said island regions inn which the I²L element is formed, said high impurity concentration region reaching said high impurity concentration layers; a fifth step of doping an impurity in said island region to form a deep injector region of the I²L element and a deep base region of a vertical transistor, said deep injector and base regions being low impurity concentration layers of the first conductivity type; a sixth step of forming, in the base region, a collector region 18 of the vertical transistor, said region being an impurity layer of the second conductivity type; a seventh step performed after the sixth step of forming a base region of the linear transistor in at least one of the remaining island regions by doping an impurity into said island region shallower than said base region of the vertical transistor, said base region being an impurity layer of the first conductivity type; and an eighth step of forming an emitter region and a collector region of the linear transistor respectively in said base region of the linear transistor and said remaining island region, said collector region of the linear transistor being a high impurity concentration layer of the second conductivity type and said emitter region of the linear transistor being an impurity layer of the second conductivity type which has an impurity concentration higher than that of the collector region of the vertical transistor which is formed in the base region thereof.

2. The method according to claim 1, wherein said collector region of the vertical transistor has an impurity concentration of approximately $2.0 \times 10^{14}/cm^2$, and said emitter region of the linear transistor has an impurity concentration of approximately $1.0 \times 10^{16}/cm^2$.

3. The method according to claim 1, wherein an impurity is diffused 1.5 microns or deeper into said island region of the $I^2L$ element, and an impurity is diffused 0.5 micron or less into said island region of the linear transistor.

4. The method according to claim 1, wherein said base region and collector region of the vertical transistor are formed by deeply implanting impurity ions, and said base region and emitter region of the linear transistor are formed by implanting impurity ions less deeply.

* * * * *